(12) United States Patent
Pan

(10) Patent No.: US 7,392,071 B2
(45) Date of Patent: Jun. 24, 2008

(54) ROTARY MODULE WITH DIGITAL CAMERA MODULE

(75) Inventor: Long-Jyh Pan, Shijr (TW)

(73) Assignees: BenQ Corporation, Taipei (TW); Qisda Corporation, Taoyuan (TW)

( * ) Notice: Subject to any disclaimer, the term of this patent is extended or adjusted under 35 U.S.C. 154(b) by 527 days.

(21) Appl. No.: 11/059,362

(22) Filed: Feb. 17, 2005

(65) Prior Publication Data

US 2005/0186996 A1  Aug. 25, 2005

(30) Foreign Application Priority Data

Feb. 20, 2004  (TW) .................................. 93104381

(51) Int. Cl.
*H04M 1/00* (2006.01)
*H04B 1/38* (2006.01)
(52) U.S. Cl. .............. 455/575.1; 455/556.1; 379/433.13
(58) Field of Classification Search .............. 455/575.1, 455/556.1
See application file for complete search history.

(56) References Cited

U.S. PATENT DOCUMENTS

| 6,879,337 B2* | 4/2005 | Tatehana et al. ......... 348/14.02 |
| 6,957,083 B2* | 10/2005 | Ikeda et al. ............... 455/556.1 |
| 7,035,665 B2* | 4/2006 | Kido et al. .................. 455/566 |
| 2001/0036845 A1* | 11/2001 | Park .......................... 455/566 |

* cited by examiner

*Primary Examiner*—Yuwen Pan
(74) *Attorney, Agent, or Firm*—Rabin & Berdo, PC

(57) ABSTRACT

A rotary module comprises: a digital camera module (DCM) electrically connected to a main body of an electronic product; a hinge assembly connected to a holding device (HD) and the main body, so as to allow relative rotation between the main body and the flip cover; a flexible printed circuit board (FPCB); and the HD to hold the DCM, and provide a wiring space for winding the FPCB and a hollow sleeve for receiving the hinge assembly. One end of the FPCB is connected to the DCM, and the rest extends along the flat surface of the HD, then winds around the wiring space, and finally connects to a PCB of either the main body or the flip cover. The rotary module could be disposed in an axial sleeve of flip-type cellular phone. When the flip cover is rotated, the HD and the DCM simultaneously rotate with the flip cover.

24 Claims, 6 Drawing Sheets

ROTARY MODULE WITH DIGITAL CAMERA MODULE

This application claims the benefit of Taiwan application Ser. No. 93104381, filed Feb. 20, 2004, the subject matter of which is incorporated herein by reference.

BACKGROUND OF THE INVENTION

1. Field of the Invention

The invention relates in general to a rotary module, and more particularly to the rotary module having a digital camera module (DCM).

2. Description of the Related Art

Recently, there has been an increased demand in the marketplace for multi-mode cellular phones, particularly the cellular phones with photo-taking mode. With the cellular phone having photo-taking mode, a user can take a picture of anything (without intruding on other's privacies), and transmit the captured image anytime and anywhere.

Most of conventional multi-mode cellular phones are designed by externally connecting the digital camera module to the main body of cellular phone. This external-type digital camera module is generally bulky, and inconvenient to carry. Also, the overall size and weight of the cellular phone are increased after the digital camera module is externally attached to the main body of cellular phone. Now, more and more manufacturers have developed new types of multi-mode cellular phones. For the phones without a flip cover, the digital camera modules are commonly positioned at the main boards. For the phones with the flip covers, the digital camera modules are commonly positioned at the corners of the covers. There remains a need in the art, however, for improving the view finding of photo-taking, the size and the production cost of the cellular phone.

SUMMARY OF THE INVENTION

It is therefore an object of the invention to provide a rotary module with digital camera module. By designing a holding device having a special configuration, and assembling the holding device, digital camera module and flexible printed circuit board, it is much easier and timesaving to assemble the digital camera module and a hinge assembly with the applied electronic device (such as a cellular phone). Also, the well-assembled rotary module is very small and light.

The invention achieves the objects by providing a rotary module with a digital camera module. The rotary module comprises a digital camera module, electrically connected to a main body of an electronic device; a hinge assembly, and two ends respectively connected to a holding device and the main body so as to allow a relative rotation between a flip cover and the main body; a flexible printed circuit board (FPCB); and the holding device, for placing the digital camera module. The holding device has a hollow sleeve for receiving the hinge assembly and provides a winding portion around which part of the FPCB winds. Also, one end of the FPCB is electrically connected to the digital camera module, and the rest of the FPCB stretches at a bottom surface of the holding device, and winds around the winding portion of the hollow sleeve, and then is extended toward either the flip cover or the main body for electrical connection.

The rotary module can be installed in an electronic device, for example, secured in the axial sleeve of a cellular phone. When a relative rotation between the flip cover and the main body of the cellular phone is performed, the holding device of the rotary module and the digital camera module are simultaneously rotated with the flip cover. The flip cover could be opened or closed when a photo-taking mode is in use.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
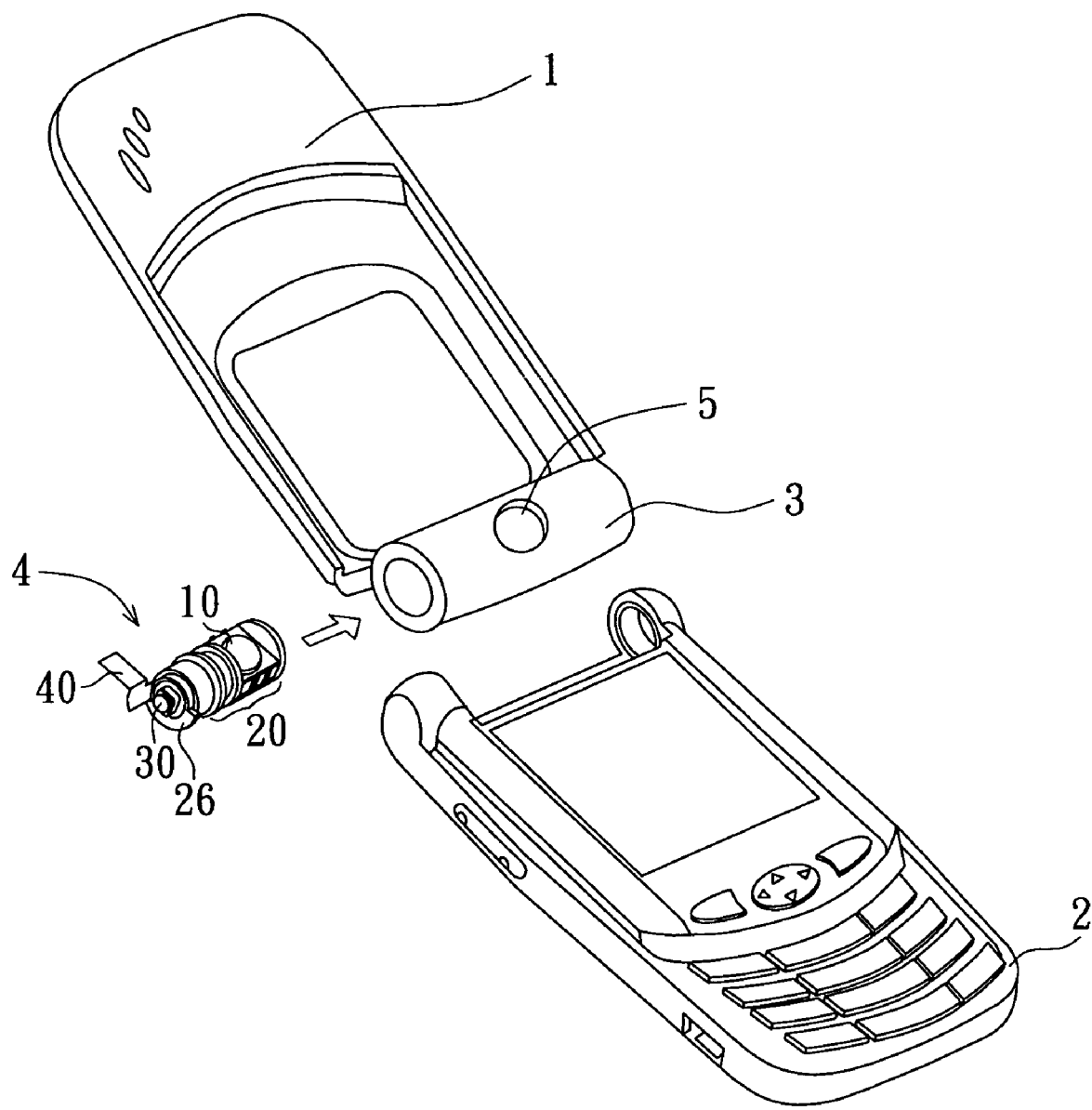
FIG. 1 illustrates a rotary module with a digital camera module assembled with the cellular phone according to the preferred embodiment of the invention.

The invention provides a rotary module with a digital camera module applied in an electronic product. By designing a holding device having a special configuration, and assembling the holding device, digital camera module and flexible printed circuit board, the flip cover rotating with respect to the main body also possesses the function of photo-taking. According to the embodiment of the invention, a cellular phone is illustrated as an electronic product in the application.

Also, the embodiment disclosed herein is for illustrating the invention, but not for limiting the scope of the invention. Additionally, the drawings used for illustrating the embodiment of the invention only show the major characteristic parts in order to avoid obscuring the invention. Accordingly, the specification and the drawing are to be regard as an illustrative sense rather than a restrictive sense.

FIG. 1 illustrates a rotary module with a digital camera module assembled with the cellular phone according to the preferred embodiment of the invention. The flip cover 1, which has a display (as shown in FIG. 1) or not, is assembled with the main body 2. An axial sleeve 3 connected to the end of the flip cover 1 is used for receiving the rotary module 4 with a digital camera module 10. Preferably, the axial sleeve 3 and the flip cover 1 are integrated as a whole. During assembling, the rotary module 4 is inserted into the axial sleeve 3, and the assembly direction is specified by the arrow in FIG. 1; then, the flip cover 1 and the main body 2 are rotatably connected. Also, there is a transparent aperture 5 on the axial sleeve 3. The transparent aperture 5 is positioned and shaped with respect to the digital camera module 10, for being a view-finding window.

Figure 2A:
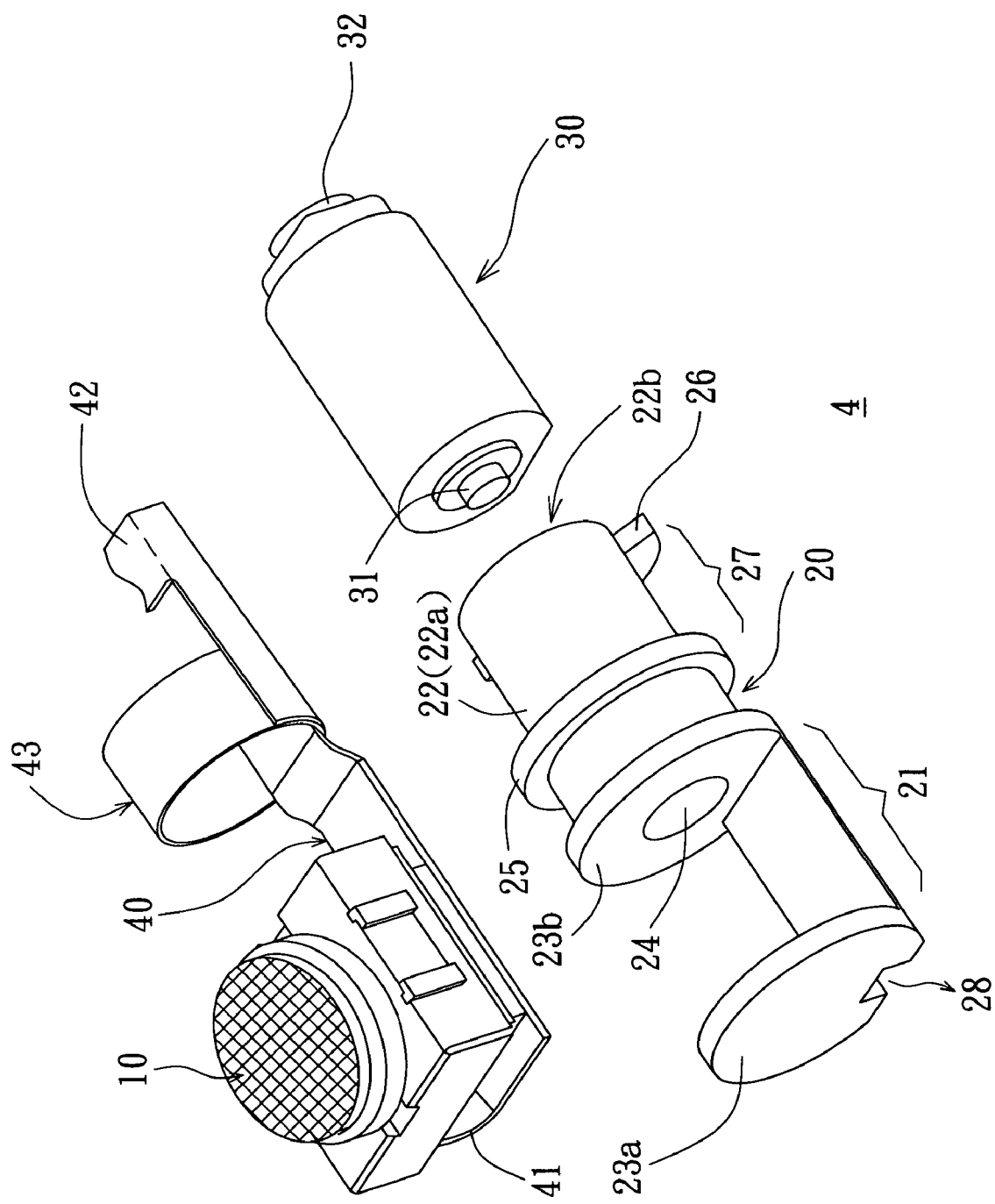
FIG. 2A illustrates the disassembled parts of the rotary module of FIG. 1.

FIG. 2A illustrates the disassembled parts of the rotary module of FIG. 1. The rotary module 4 of the embodiment comprises a digital camera module 10, a holding device 20, a hinge assembly 30 and a flexibled printed circuit board (FPCB) 40.

The digital camera module 10 is electrically connected to the main body 2. When a user takes a picture, the data is transmitted to a processing system of the main body 2, and the image captured by the digital camera module 10 is shown on the display after processing. The digital camera module 10 could be a still digital camera module, or a video camera module.

The holding device 20 comprises a positioning groove 21, a hollow sleeve 22 and a securing portion. The positioning groove 21, used for placing the digital camera module 10, has a first sidewall 23a and a second sidewall 23b formed opposite. Preferably, the distance between the first sidewall 23a and the second sidewall 23b is substantially identical to the size of the digital camera module 10, so that the first sidewall 23a and the second sidewall 23b can be tightly against the lateral sides of the digital camera module 10. Also, there is a hole 24 opened through the second sidewall 23b, and the positioning groove 21 communicates with the hollow sleeve 22 through the hole 24.

The hollow sleeve 22 is laterally elongated from one side of the positioning groove 21, and has an insertion hole 22b for placing the hinge assembly 30. The hinge assembly 30 is assembled to the holding device 20 by receiving the hinge assembly 30 in the insertion hole 22b. In this embodiment, the digital camera module 10 secured on the holding device 20 is rotated with the rotation of the filp cover 1 (the detail described later), and so is one end 31 of the hinge assembly 30 (i.e. the end 31 connected to the digital camera module 10 through the hole 24). The other end 32 of the hinge assembly 30 is fixed on the main body 2.

In this embodiment, a stopper ring 25 and a stopper plate 26 are preferably formed on the outer surface 22a of the hollow sleeve 22. The space between the stopper ring 25 and the stopper plate 26 properly creates a winding portion 27 for winding the flexible printed circuit board 40 without sliding off. The stopper plate 26 is preferably formed at the end of the hollow sleeve 22. Additionally, a notch 28 formed at the first sidewall 23a functions as the securing portion of the holding device 20 in this embodiment. By mating the notch 28 and the rib 50 shown in FIG. 3 of the axial sleeve 3, the rotary module 4 can be fixed within the axial sleeve 3, and simultaneously rotated with respect to the rotation of the flip cover 1.

It is, of course, noted that the fixation between the rotary module 4 and the axial sleeve 3 is not limited in the way described herein. For example, the notch and the rib could be respectively formed on the axial sleeve 3 and the holding device 20 for achieving the purpose of fixation.

Figure 2B:
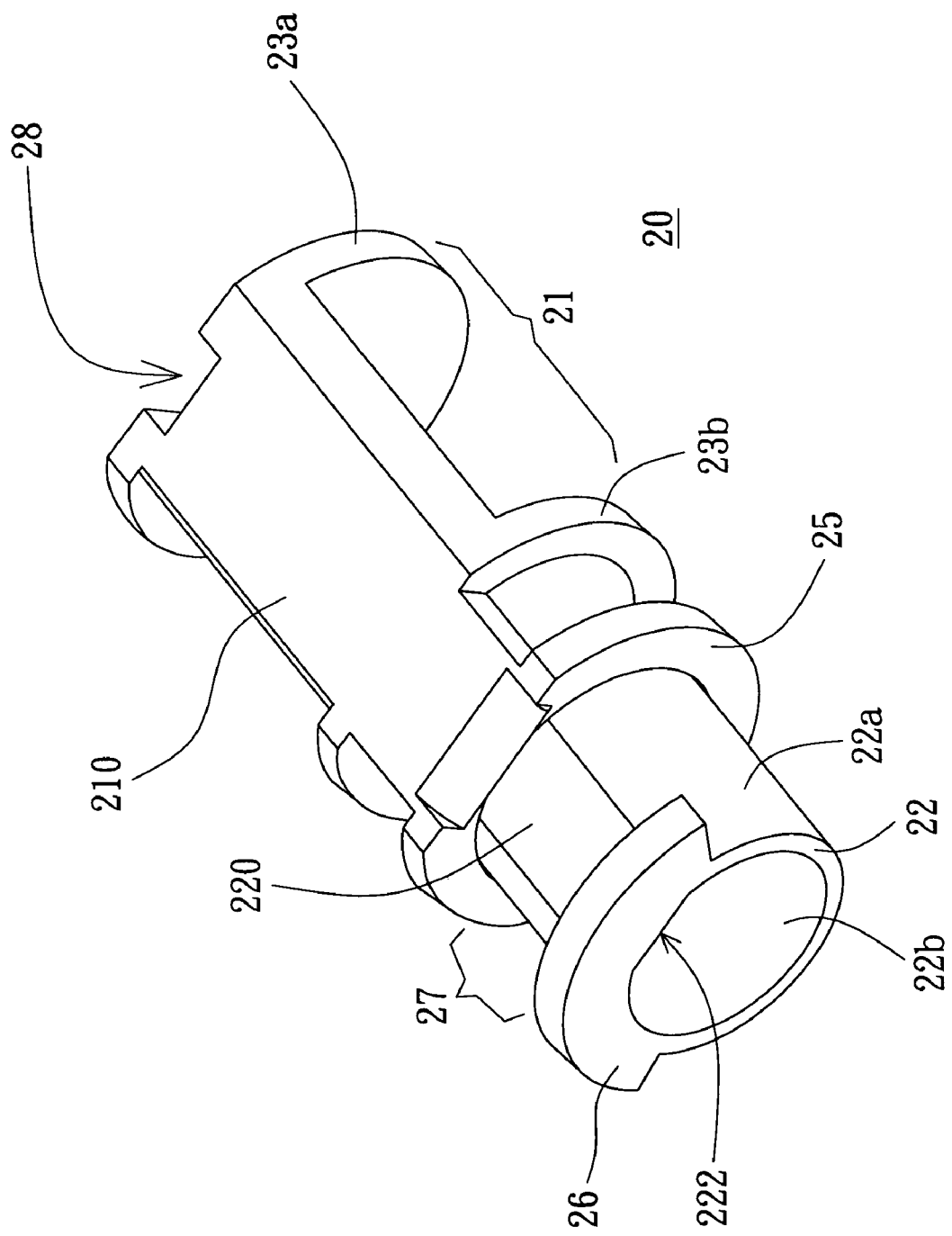
FIG. 2B illustrates the bottom of the hold device in FIG. 2A.

FIG. 2B illustrates the bottom of the hold device in FIG. 2A. The bottom of the holding device 20, including the bottom surfaces 210 and 220 of the positioning groove 21 and the hollow sleeve 22, is a flat surface. Moreover, FIG. 2B clearly shows the insertion hole 22b of the hollow sleeve 22 has a non-circular cross section, and the plane face 222 is used for constraining the rotation of the hinge assembly 30 within the hollow sleeve 22. Preferably, the shape and the size of the hinge assembly 30 are identical to that of the insertion hole 22b of the hollow sleeve 22.

Figure 2C:
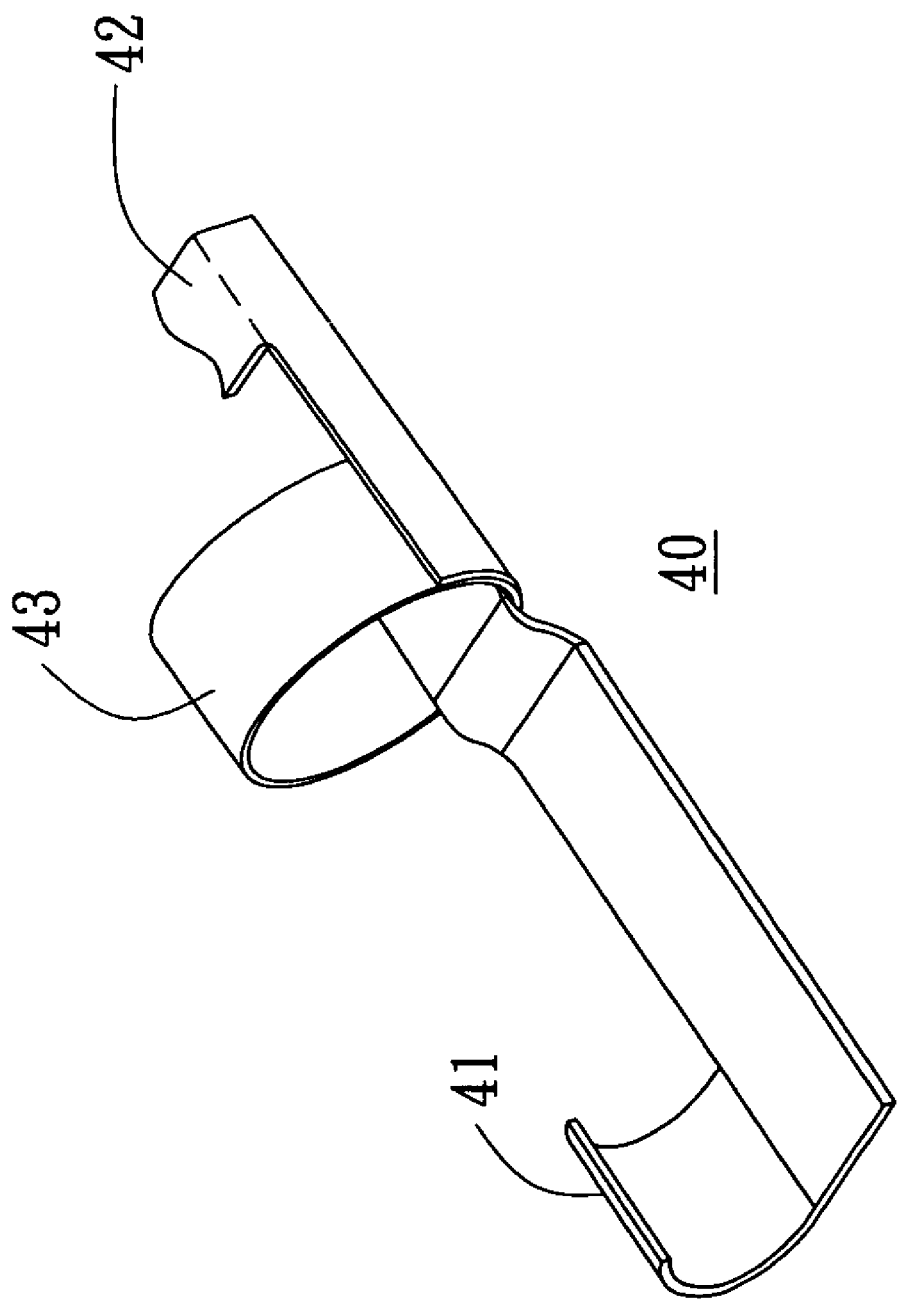
FIG. 2C illustrates the flexible printed circuit board of FIG. 2A.

FIG. 2C illustrates the flexible printed circuit board of FIG. 2A. The flexible printed circuit board (FPCB) 40 comprises a first connecting end 41, a second connecting end 42 and an extending portion 43. The first connecting end 41 is electrically connected to the digital camera module 10. The second connecting end 42 is electrically connected to the PCB disposed in the flip cover of the main body. Two ends of the extending portion 43 respectively joint the first connecting end 41 and the second connecting end 42. Part of the extending portion 43 winds around the outer surface 22a of the hollow sleeve 22 (see FIG. 2A).

During assembly, the first connecting end 41 of the FPCB 40 is connected to the digital camera module 10, and the rest of the FPCB 40 goes to the back of the holding device 20 and stretches from the bottom surface 210 of the positioning groove to the bottom surface 220 of the hollow sleeve 22 for performing the winding action in the winding portion 27. After the winding action is done, the FPCB 40 is away from the hollow sleeve 22 and extended toward either the flip cover 1 or the main body 2. In this embodiment, the FPCB 40 is extended toward the main body 2 and connected to the PCB of main body 2 through the second connecting end 42. The second connecting end 42 can be electrically connected to the main body 2 through a FPCB connector or a board-to-board connector.

Figure 3:
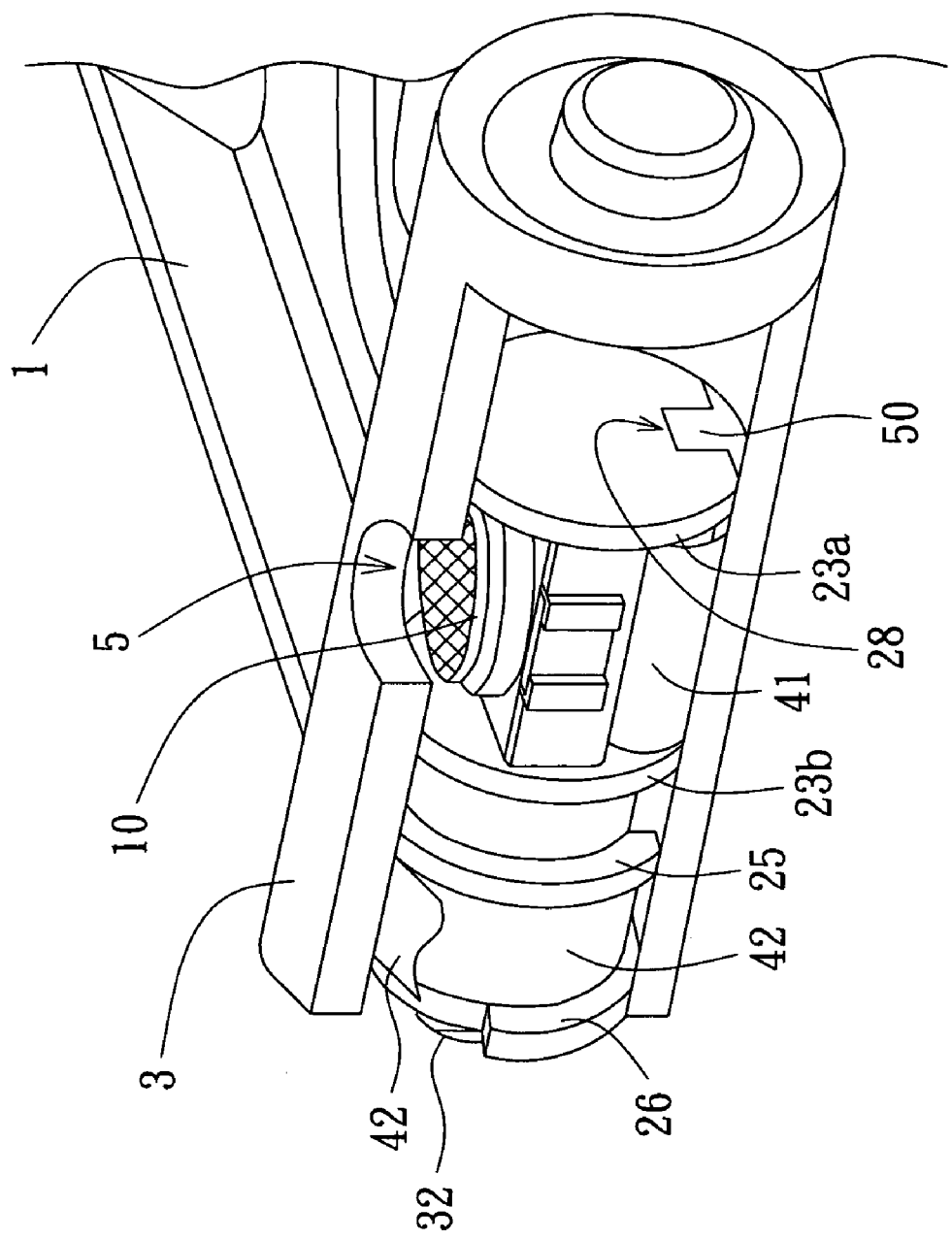
FIG. 3 illustrates the rotary module assembled within the axial sleeve according to the embodiment of the invention.

FIG. 3 illustrates the rotary module assembled within the axial sleeve according to the embodiment of the invention. Please also refer FIG. 1 and FIG. 2A. As shown in FIG. 3, a rib 50 is formed at the inner wall of the axial sleeve 3, and mated with the notch 28 of the first sidewall 23a. Accordingly, the rotary module and the digital camera module 10 are simultaneously rotated with the axial sleeve 3. In this embodiment, the axial sleeve 3 and the flip cover 1 are integrated in a single module. When a user opens the flip cover 1, the axial sleeve 3, the rotary module 4 and the digital camera module 10 are simultaneously rotated with the flip cover 1. Through the transparent aperture 5, the digital camera module can perform the camera function and take a picture.

Figure 4A:
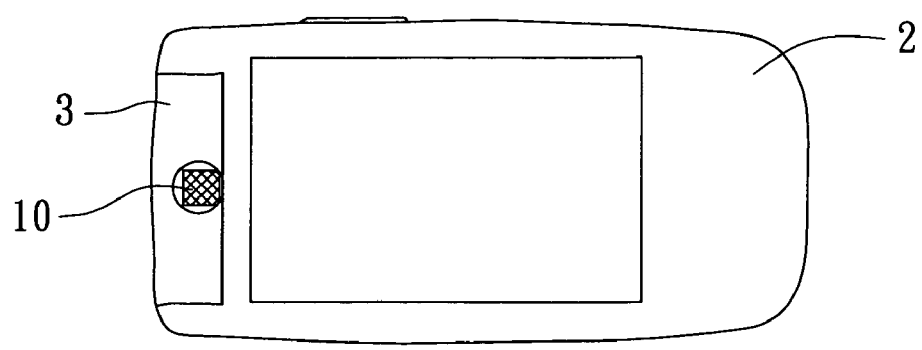
FIG. 4A is a bottom view of a cellular phone with the digital camera module according to the embodiment of the invention.
Figure 4B:
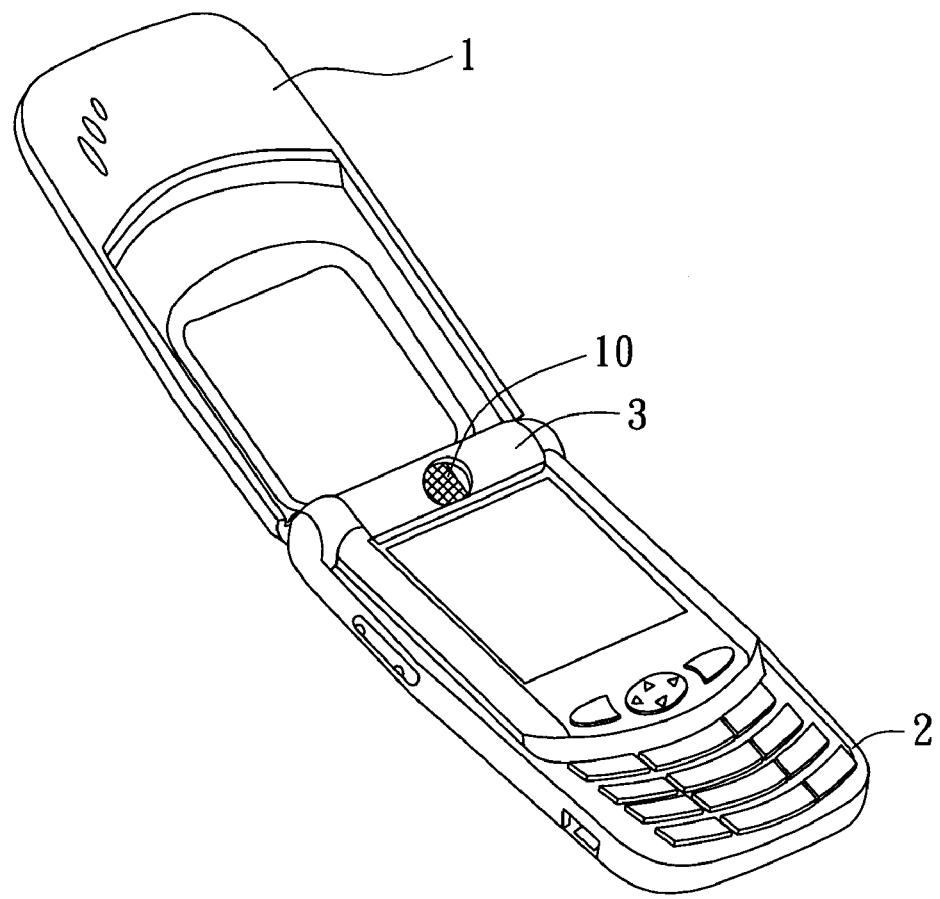
FIG. 4B illustrates the opened flip cover of the cellular phone according to the embodiment of the invention.

FIG. 4A is a bottom view of a cellular phone with the digital camera module according to the embodiment of the invention. When the flip cover 1 is closed, the digital camera module 10 secured in the axial sleeve 3 is turned to the back of the cellular phone. FIG. 4B illustrates the opened flip cover of the cellular phone according to the embodiment of the invention. When the flip cover 1 is opened, the digital camera module 10 secured in the axial sleeve 3 faces the user. Accordingly, when the user wants to take a picture of scenery, thing, friend or family, the backside of the cellular phone faces the to-be-photoed object as shown in FIG. 4A for photo taking. If the user wants to take a photo of self, the flip cover 1 is opened as shown in FIG. 4B for photo taking.

According to the aforementioned description, the rotary module with the digital camera module of the invention is provided by assembling a holding device (integrated as a single module) 20 with the digital camera module 10, a hinge assembly 30 and a flexible printed circuit board 40. Thus, it is very easy and timesaving to assemble the rotary module 4 within the axial sleeve 3 of the cellular phone. Also, the assembled rotary module 4 having small size and camera function can be rotated simultaneously with the flip cover. Without causing an effect on the flip-open and flip-close actions, the electronic product applied with the rotary module of the invention has the advantages of packed size, easy-to-photo, and low production cost.

While the invention has been described by way of examples and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A rotary module, disposed in an electronic product for allowing a relative rotation between a first portion and a second portion of the electronic product, the rotary module comprising:
   a supplement module;
   a holding device, comprising:
      a positioning groove, for placing the supplement module;
      a hollow sleeve, having an insertion hole; and
      a securing portion, for securing the holding device on the first portion of the electronic product;
   a hinge assembly, disposed in the insertion hole, and two ends of the hinge assembly respectively connected to the holding device and the second portion so as to allow the relative rotation between the first portion and the second portion; and a flexible printed circuit board, comprising:
  a first connecting end, electrically connected to the supplement module;
  a second connecting end, electrically connected to one of the first portion and the second portion of the electronic product;
  an extending portion, jointing the first connecting end and the second connecting end, and a portion of the extending portion winding around an outer surface of the hollow sleeve;
wherein the holding device and the supplement module are simultaneously rotated with the first portion when the relative rotation between the first portion and the second portion of the electronic product is performed.

2. The rotary module according to claim 1, wherein an axial sleeve rotatably connecting the first portion and second portion of the electronic product is used for disposing the rotary module.

3. The rotary module according to claim 2, wherein the axial sleeve has a transparent aperture formed at a position with respect to the supplement module.

4. The rotary module according to claim 2, wherein the axial sleeve and the first portion are integrated in a single module.

5. The rotary module according to claim 4, wherein the securing portion of the holding device is a notch, and the notch is mated with a rib of the axial sleeve.

6. The rotary module according to claim 4, wherein the securing portion of the holding device is a rib, and the rib is mated with a notch of the axial sleeve.

7. The rotary module according to claim 1, wherein the positioning groove of the holding device has a first sidewall and a second sidewall formed opposite for tightly against the lateral sides of the supplement module.

8. The rotary module according to claim 7, wherein a distance between the first sidewall and the second sidewall is substantially identical to a size of the supplement module.

9. The rotary module according to claim 1, wherein a stopper ring and a stopper plate are formed at the outer surface of the hollow sleeve, and a space between the stopper ring and the stopper plate properly creates a winding portion for winding the extending portion of the flexible printed circuit board.

10. The rotary module according to claim 9, wherein the stopper plate is formed at one end of the hollow sleeve.

11. The rotary module according to claim 9, wherein the extending portion of the flexible printed circuit board stretches at a bottom surface of the positioning groove, and winds around the winding portion of the hollow sleeve, and then is extended toward either the first portion or the second portion of the electronic product.

12. The rotary module according to claim 1, wherein a shape and a size of the hinge assembly are identical to that of the insertion hole of the hollow sleeve.

13. The rotary module according to claim 1, wherein the second connecting end is electrically connected to the second portion of the electronic product.

14. The rotary module according to claim 13, wherein the second connecting end is electrically connected to the second portion through a FPCB connector.

15. The rotary module according to claim 13, wherein the second connecting end is electrically connected to the second portion through a board-to-board connector.

16. An electronic device, comprising:
  a main body, having a printed circuit board;
  a flip cover, having an axial sleeve, and rotatably connected to the main body;
  a rotary module having a digital camera module, disposed within the axial sleeve, the rotary module comprising:
    a digital camera module;
    a holding device, comprising:
      a positioning groove, for placing the digital camera module;
      a hollow sleeve, laterally elongated from one side of the positioning groove and having an insertion hole; and
      a securing portion, for securing the holding device on the flip cover of the electronic device;
    a hinge assembly, disposed in the insertion hole, and two ends of the hinge assembly respectively connected to the holding device and the main body so as to allow a relative rotation between the flip cover and the main body; and
    a flexible printed circuit board, comprising:
      a first connecting end, electrically connected to the digital camera module;
      a second connecting end, electrically connected to the printed circuit board of the main body; and
      an extending portion, jointing the first connecting end and the second connecting end, and a portion of the extending portion winding around an outer surface of the hollow sleeve;
  wherein the holding device and the digital camera module are simultaneously rotated with the flip cover when the relative rotation between the flip cover and the main body is performed.

17. The electronic device according to claim 16, wherein the axial sleeve has a transparent aperture formed at a position with respect to the digital camera module.

18. The electronic device according to claim 16, wherein the axial sleeve, and the first portion are integrated in a single module.

19. The electronic device according to claim 16, wherein the securing portion of the holding device is a notch, and the notch is mated with a rib of the axial sleeve.

20. The electronic device according to claim 16, wherein the securing portion of the holding device is a rib, and the rib is mated with a notch of the axial sleeve.

21. The electronic device according to claim 16, wherein the positioning groove of the holding device has a first sidewall and a second sidewall formed opposite for tightly against the lateral sides of the digital camera module.

22. The electronic device according to claim 16, wherein a stopper ring and a stopper plate are formed at the outer surface of the hollow sleeve, and a space between the stopper ring and the stopper plate properly creates a winding portion for winding the extending portion of the flexible printed circuit board.

23. The electronic device according to claim 16, wherein the stopper plate is formed at one end of the hollow sleeve.

24. The electronic device according to claim 16, wherein the extending portion of the flexible printed circuit board stretches at a bottom surface of the positioning groove, and winds around the winding portion of the hollow sleeve, and then is extended toward the main body.

* * * * *